United States Patent
Koon et al.

(10) Patent No.: US 8,637,973 B2
(45) Date of Patent: Jan. 28, 2014

(54) PACKAGED MICROELECTRONIC COMPONENTS WITH TERMINALS EXPOSED THROUGH ENCAPSULANT

(75) Inventors: Eng Meow Koon, Singapore (SG); Low Siu Waf, Singapore (SG); Chan Min Yu, Singapore (SG); Chia Yong Poo, Singapore (SG); Ser Bok Leng, Singapore (SG); Zhou Wei, Singapore (SG)

(73) Assignee: Micron Technology, Inc., Boise, ID (US)

( * ) Notice: Subject to any disclaimer, the term of this patent is extended or adjusted under 35 U.S.C. 154(b) by 564 days.

(21) Appl. No.: 11/692,068

(22) Filed: Mar. 27, 2007

(65) Prior Publication Data

US 2008/0067642 A1 Mar. 20, 2008

Related U.S. Application Data

(60) Continuation of application No. 10/922,209, filed on Aug. 19, 2004, now Pat. No. 7,195,957, which is a division of application No. 10/230,761, filed on Aug. 28, 2002, now Pat. No. 6,836,009.

(30) Foreign Application Priority Data

Aug. 8, 2002 (SG) .................. 200204788-4

(51) Int. Cl.
*H01L 23/52* (2006.01)
(52) U.S. Cl.
USPC ........... 257/692; 257/678; 257/686; 257/690; 257/734; 257/693; 257/696
(58) Field of Classification Search
USPC .................. 257/686, 693, 696, 786, 692
See application file for complete search history.

(56) References Cited

U.S. PATENT DOCUMENTS

| 4,012,579 A | 3/1977 | Fox et al. |
| 4,862,245 A | 8/1989 | Pashby et al. |
| 5,128,831 A | 7/1992 | Fox, III et al. |
| 5,140,404 A | 8/1992 | Fogal et al. |
| 5,157,480 A * | 10/1992 | McShane et al. ............. 257/693 |
| 5,252,853 A | 10/1993 | Michii |
| 5,252,857 A | 10/1993 | Kane et al. |

(Continued)

FOREIGN PATENT DOCUMENTS

JP    11-258290    9/1999

OTHER PUBLICATIONS

Amkor Technology, MicroLeadFrame (MLF), 5 pages, retrieved from the Internet on Aug. 1, 2001, <http://www.amkor.com/Products/all_products/MLF.cfm>.

(Continued)

*Primary Examiner* — Eva Yan Montalvo
(74) *Attorney, Agent, or Firm* — Perkins Coie LLP

(57) ABSTRACT

A microelectronic component package includes a plurality of electrical leads which are coupled to a microelectronic component and which have exposed lengths extending outwardly beyond a peripheral edge of an encapsulant. A plurality of terminals may be positioned proximate a terminal face of the encapsulant and these terminals may be electrically coupled to the same leads. This can facilitate connection of the microelectronic component to a substrate using the leads as a conventional leaded package. The terminals, however, can facilitate stacking of the leaded package with one or more additional microelectronic components, e.g., a BGA package.

18 Claims, 6 Drawing Sheets

(56) References Cited

U.S. PATENT DOCUMENTS

| | | | |
|---|---|---|---|
| 5,304,842 A | 4/1994 | Farnworth et al. | |
| 5,471,369 A | 11/1995 | Honda et al. | |
| 5,475,918 A | 12/1995 | Kubota et al. | |
| 5,518,957 A | 5/1996 | Kim et al. | |
| 5,536,969 A | 7/1996 | Matsuoka | |
| 5,583,371 A | 12/1996 | Hori | |
| 5,593,927 A | 1/1997 | Farnworth et al. | |
| 5,663,593 A | 9/1997 | Mostafazadeh et al. | |
| 5,665,651 A | 9/1997 | Asada et al. | |
| 5,677,566 A * | 10/1997 | King et al. | 257/666 |
| 5,696,033 A | 12/1997 | Kinsman | |
| 5,715,593 A | 2/1998 | Kimura | |
| 5,729,049 A | 3/1998 | Corisis et al. | |
| 5,739,585 A | 4/1998 | Akram et al. | |
| 5,744,827 A | 4/1998 | Jeong et al. | |
| D394,844 S | 6/1998 | Farnworth et al. | |
| 5,815,000 A | 9/1998 | Farnworth et al. | |
| D402,638 S | 12/1998 | Farnworth et al. | |
| 5,847,455 A | 12/1998 | Manteghi | |
| 5,851,845 A | 12/1998 | Wood et al. | |
| 5,866,939 A | 2/1999 | Shin et al. | |
| 5,866,953 A | 2/1999 | Akram et al. | |
| 5,879,965 A | 3/1999 | Jiang et al. | |
| 5,883,426 A | 3/1999 | Tokuno et al. | |
| 5,891,753 A | 4/1999 | Akram | |
| 5,891,797 A | 4/1999 | Farrar | |
| 5,893,726 A | 4/1999 | Farnworth et al. | |
| 5,898,224 A | 4/1999 | Akram | |
| 5,933,713 A | 8/1999 | Farnworth | |
| 5,938,956 A | 8/1999 | Hembree et al. | |
| 5,946,553 A | 8/1999 | Wood et al. | |
| 5,956,236 A | 9/1999 | Corisis et al. | |
| 5,958,100 A | 9/1999 | Farnworth et al. | |
| 5,973,393 A | 10/1999 | Chia et al. | |
| 5,973,396 A | 10/1999 | Farnworth | |
| 5,986,209 A | 11/1999 | Tandy | |
| 5,989,941 A | 11/1999 | Wensel | |
| 5,990,566 A | 11/1999 | Farnworth et al. | |
| 5,994,784 A | 11/1999 | Ahmad | |
| RE36,469 E | 12/1999 | Wood et al. | |
| 6,008,070 A | 12/1999 | Farnworth | |
| 6,020,624 A | 2/2000 | Wood et al. | |
| 6,020,629 A | 2/2000 | Farnworth et al. | |
| 6,025,728 A | 2/2000 | Hembree et al. | |
| 6,028,356 A | 2/2000 | Kimura | |
| 6,028,365 A | 2/2000 | Akram et al. | |
| 6,046,496 A | 4/2000 | Corisis et al. | |
| 6,048,744 A | 4/2000 | Corisis et al. | |
| 6,048,755 A | 4/2000 | Jiang et al. | |
| 6,049,125 A | 4/2000 | Brooks et al. | |
| 6,051,878 A | 4/2000 | Akram et al. | |
| 6,060,778 A | 5/2000 | Jeong et al. | |
| 6,066,514 A | 5/2000 | King et al. | |
| 6,072,233 A | 6/2000 | Corisis et al. | |
| 6,072,236 A | 6/2000 | Akram et al. | |
| 6,075,284 A | 6/2000 | Choi et al. | |
| 6,075,288 A | 6/2000 | Akram | |
| 6,089,920 A | 7/2000 | Farnworth et al. | |
| 6,094,058 A | 7/2000 | Hembree et al. | |
| 6,097,087 A | 8/2000 | Farnworth et al. | |
| 6,103,547 A | 8/2000 | Corisis et al. | |
| 6,107,122 A | 8/2000 | Wood et al. | |
| 6,107,680 A | 8/2000 | Hodges | |
| 6,117,382 A | 9/2000 | Thummel | |
| 6,117,710 A | 9/2000 | Mostafazadeh et al. | |
| 6,124,634 A | 9/2000 | Akram et al. | |
| 6,133,068 A | 10/2000 | Kinsman | |
| 6,137,162 A | 10/2000 | Park et al. | |
| 6,148,509 A | 11/2000 | Schoenfeld et al. | |
| 6,150,710 A | 11/2000 | Corisis | |
| 6,150,717 A | 11/2000 | Wood et al. | |
| 6,153,924 A | 11/2000 | Kinsman | |
| 6,159,764 A | 12/2000 | Kinsman et al. | |
| 6,172,419 B1 | 1/2001 | Kinsman | |
| 6,175,149 B1 | 1/2001 | Akram | |
| 6,184,465 B1 | 2/2001 | Corisis | |
| 6,198,172 B1 | 3/2001 | King et al. | |
| 6,208,020 B1 | 3/2001 | Minamio et al. | |
| 6,208,519 B1 | 3/2001 | Jiang et al. | |
| 6,210,992 B1 | 4/2001 | Tandy et al. | |
| 6,212,767 B1 | 4/2001 | Tandy | |
| 6,215,175 B1 | 4/2001 | Kinsman | |
| 6,215,177 B1 | 4/2001 | Corisis et al. | |
| 6,225,689 B1 | 5/2001 | Moden et al. | |
| 6,228,548 B1 | 5/2001 | King et al. | |
| 6,228,687 B1 | 5/2001 | Akram et al. | |
| 6,229,202 B1 | 5/2001 | Corisis | |
| 6,232,229 B1 | 5/2001 | Reinberg | |
| 6,235,554 B1 | 5/2001 | Akram et al. | |
| 6,246,108 B1 | 6/2001 | Corisis et al. | |
| 6,246,110 B1 | 6/2001 | Kinsman et al. | |
| 6,258,623 B1 | 7/2001 | Moden et al. | |
| 6,258,624 B1 | 7/2001 | Corisis | |
| 6,259,153 B1 | 7/2001 | Corisis | |
| 6,261,865 B1 | 7/2001 | Akram | |
| 6,265,660 B1 | 7/2001 | Tandy | |
| 6,277,671 B1 | 8/2001 | Tripard | |
| 6,277,704 B1 | 8/2001 | Reinberg | |
| 6,281,577 B1 | 8/2001 | Oppermann et al. | |
| 6,284,571 B1 | 9/2001 | Corisis et al. | |
| 6,291,894 B1 | 9/2001 | Farnworth et al. | |
| 6,294,839 B1 | 9/2001 | Mess et al. | |
| 6,297,543 B1 | 10/2001 | Hong et al. | |
| 6,297,547 B1 | 10/2001 | Akram | |
| 6,303,469 B1 | 10/2001 | Larson et al. | |
| 6,303,981 B1 | 10/2001 | Moden | |
| 6,303,985 B1 | 10/2001 | Larson et al. | |
| 6,310,390 B1 | 10/2001 | Moden | |
| 6,314,639 B1 | 11/2001 | Corisis | |
| 6,316,285 B1 | 11/2001 | Jiang et al. | |
| 6,326,242 B1 | 12/2001 | Brooks et al. | |
| 6,326,244 B1 | 12/2001 | Brooks et al. | |
| 6,326,687 B1 | 12/2001 | Corisis | |
| 6,326,697 B1 | 12/2001 | Farnworth | |
| 6,326,698 B1 | 12/2001 | Akram | |
| 6,329,220 B1 | 12/2001 | Bolken et al. | |
| 6,329,705 B1 | 12/2001 | Ahmad | |
| 6,331,221 B1 | 12/2001 | Cobbley | |
| 6,331,448 B1 | 12/2001 | Ahmad | |
| 6,331,453 B1 | 12/2001 | Bolken et al. | |
| 6,332,766 B1 | 12/2001 | Thummel | |
| 6,337,510 B1 | 1/2002 | Chun-Jen et al. | |
| 6,339,254 B1 | 1/2002 | Venkateshwaran et al. | |
| 6,344,976 B1 | 2/2002 | Schoenfeld et al. | |
| 6,403,398 B2 | 6/2002 | Ohuchi et al. | |
| 6,429,528 B1 | 8/2002 | King et al. | |
| 6,498,393 B2 | 12/2002 | Fujimoto et al. | |
| 6,501,184 B1 | 12/2002 | Shin et al. | |
| 6,516,516 B1 | 2/2003 | Lee | |
| 6,518,659 B1 | 2/2003 | Glenn | |
| 6,576,494 B1 | 6/2003 | Farnworth | |
| 6,630,726 B1 * | 10/2003 | Crowley et al. | 257/666 |
| 6,630,729 B2 | 10/2003 | Huang | |
| 6,646,334 B2 | 11/2003 | Hur et al. | |
| 6,819,003 B2 | 11/2004 | Farnworth | |
| 6,830,955 B2 | 12/2004 | Shin et al. | |
| 6,836,009 B2 | 12/2004 | Koon et al. | |
| 6,841,423 B2 | 1/2005 | Farnworth | |
| 6,876,066 B2 | 4/2005 | Fee et al. | |
| 6,951,982 B2 | 10/2005 | Chye et al. | |
| 7,195,957 B2 | 3/2007 | Koon et al. | |
| 2003/0164554 A1 | 9/2003 | Fee et al. | |
| 2003/0193091 A1 * | 10/2003 | Yu et al. | 257/666 |
| 2005/0046000 A1 | 3/2005 | Seng et al. | |

OTHER PUBLICATIONS

Application Notes for Surface Mount Assembly of Amkor's Micro LeadFrame (MLF) Packages, Amkor Technology, West Chester, PA, Mar. 2001, 14 pages.

Automotive/Thermal Enhanced Power Products, Amkor Technology, West Chester, PA, Aug. 2000, 16 pages.

(56) References Cited

OTHER PUBLICATIONS

Carson, John C., "Advances in Chip Level Packaging," Irvine Sensors Corporation, Costa Mesa, California, 36 pages, retrieved from the Internet on Sep. 22, 2003, <http://www.ece.jhu.edu/faculty/andreou/495/2002/LectureNotes/PackagingAdvancedpdf.pdf>.

Intersil, L56.8X8 56 Lead Quad Flat No-Lead Plastic Package, 1 page, Dec. 2002, <http://www.intersil.conn/data/pk/L56.8X8.pdf>.

Ishino, Toshiaki, Silicone Adhesive Tape, Nitto Technical Report, vol. 38, No. 2, pp. 49-50, Dec. 2000, <http://www.nitto.com/rd/2000_2/15ishinoe.qxp.pdf>.

Kuhnlein, Gerd, "A design and manufacturing solution for high reliable non-leaded CSP's like QFN," 2000 Electronics Packaging Technology Conference, pp. 169-175.

RF Wireless Fact Sheet, Amkor Technology, West Chester, PA, Feb. 2000.

Search Report and Written Opinion for Singapore Application No. SG 200204788-4 dated Apr. 29, 2005.

Siliconware Precision Industries Ltd., TSOP 1 (Thin Small Outline Package Type 1), 2 pages, 2000-2002, <http://www.spil.com/tw/tsop1.html>.

Tech Connect, QFN Leadframes, ASM Pacific Technology Ltd., pp. 10-14.

\* cited by examiner

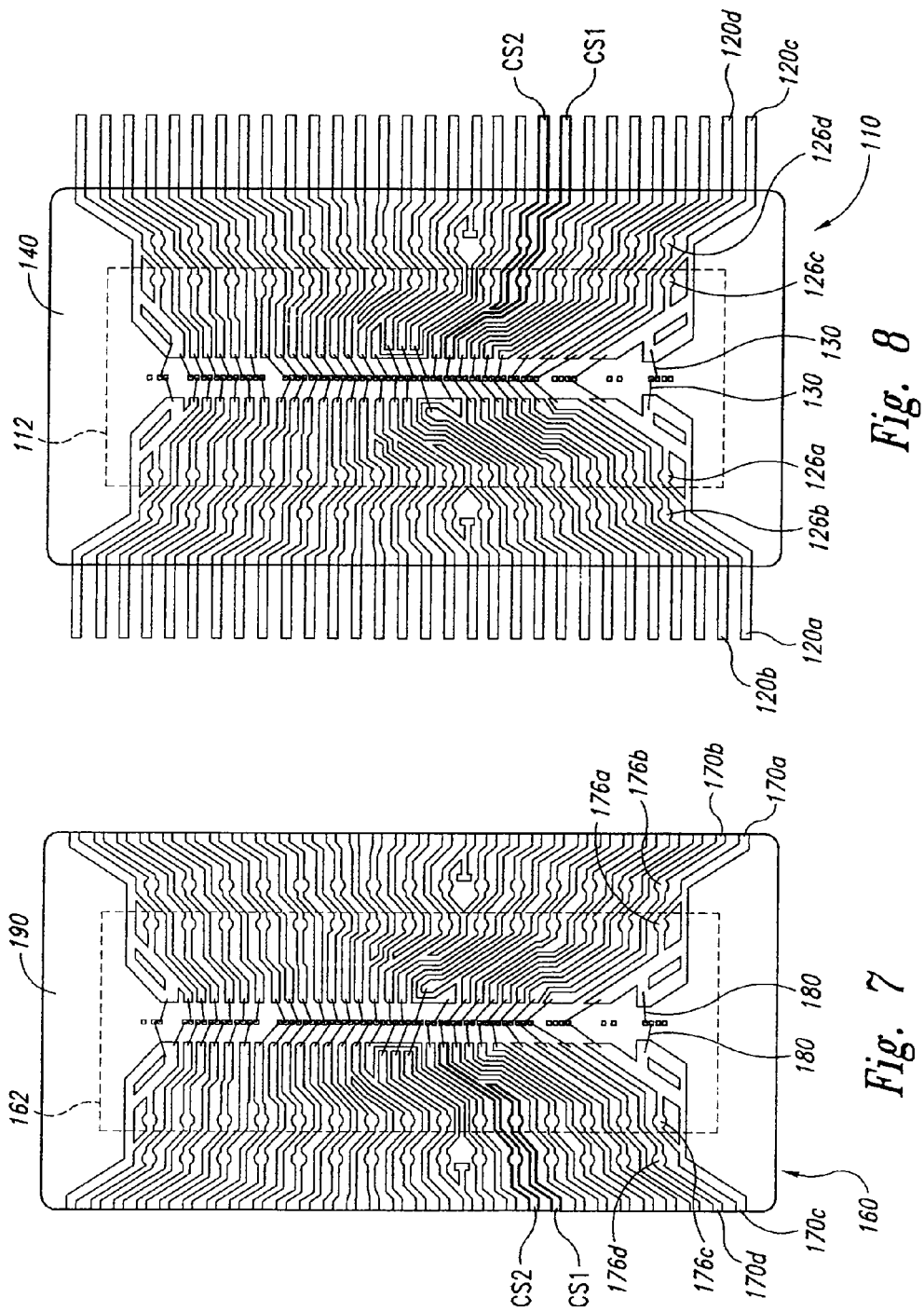

PACKAGED MICROELECTRONIC COMPONENTS WITH TERMINALS EXPOSED THROUGH ENCAPSULANT

CROSS-REFERENCE TO RELATED APPLICATIONS

This application is a continuation of U.S. application Ser. No. 10/922,209 filed Aug. 19, 2004, now U.S. Pat. No. 7,195,957, which is a divisional of U.S. application Ser. No. 10/230,761 filed Aug. 28, 2002, now U.S. Pat. No. 6,836,009, which claims foreign priority benefits of Singapore Application No. 200204788-4 filed Aug. 8, 2002, all of which are incorporated herein by reference in their entireties.

BACKGROUND

The present invention relates to packaged microelectronic components and methods for assembling the same. In particular, aspects of the invention relate to leaded microelectronic component packages and to stacked microelectronic component assemblies.

Semiconductor chips or dies are typically encapsulated in a package which protects the chips from the surrounding environment. The packages typically include leads or other connection points which allow the encapsulated chip to be electrically coupled to another microelectronic component. Leaded packages include a semiconductor chip bonded to a lead frame either seated on a die paddle or directly to the leads in a leads-over-chip attachment. The contacts pads on the semiconductor die are then electrically connected to the chip, e.g., by wirebonding. The connected lead frame and chip may then be encapsulated in an encapsulant to form a complete microelectronic component package. In most common applications, the leads extend out from the mold compound, allowing the chip to be electrically accessed. Typically, the leads extend laterally outwardly in a flat array which is part of a lead frame. This lead frame may be trimmed and formed into a desired configuration.

One technique for manufacturing microelectronic components is the "flip-chip" technique. In this approach, a microelectronic component, such as a semiconductor chip or die, includes a plurality of bond pads or other electrical contacts arranged in an array and each of these bond pads includes a solder ball. This array of solder balls, referred as a ball grid array ("BGA"), allows the microelectronic component to be attached to another element of a microelectronic component assembly by contacting the array of solder balls to a mating array of terminals carried by the other element.

While BGA chips or packages facilitate ready interconnection of microelectronic components, omitting the leads employed in a conventional leaded package sacrifices certain advantages provided by the leads. Some have proposed techniques for combining the advantages of lead frame packages with a BGA package. For example, U.S. Pat. No. 5,847,455 (Manteghi) and U.S. Pat. No. 5,663,593 (Mostafazadeh et al.), the entirety of each of which is incorporated herein by reference, are each directed to microelectronic component packages which include both electrical leads and ball grid arrays to allow the package to be mounted in a flip-chip fashion. These microelectronic component packages are formed by attaching a microelectronic component to a lead frame die paddle, wirebonding the die to the leads of the lead frame, and encapsulating the microelectronic component and the leads in an encapsulant. A solder mask is applied to the face of the lead frame facing away from the microelectronic component and holes are formed in the solder mask to expose a surface of the underlying lead. Solder balls can be disposed within the holes in the encapsulant to form a ball grid array on the package.

U.S. Pat. No. 6,028,356 (Kimura) suggests a similar approach, but proposes eliminating the solder mask. Instead, the package is encapsulated in two steps. In the first step, the microelectronic component and the side of the leads facing the microelectronic component are encapsulated; in the second step, the other side of the leads are encapsulated. The encapsulant mold used in the second step includes bumps which contact the lead frame, producing dimples that allow the leads to be electrically accessed. Solder balls may then be created in the dimples.

U.S. Pat. No. 5,866,939, the entirety of which is incorporated herein by reference, proposes another microelectronic component package which employs both leads and a BGA. The leads of the lead frame are bent, causing the ends to terminate at the surface of the package. These lead ends define an array of contacts which can bear solder balls in a ball grid array. These leads vary in length, which can compromise signal transmission, especially in higher-speed, higher-frequency devices. In addition, this approach may result in a weaker structure than may be obtained with leads extending across more of the width of the package as these leads can add additional structural reinforcement to the microelectronic component package.

Each of these references is also limited to a BGA attachment to one other microelectronic component. Although the leads are incorporated in the microelectronic component package for ease of manufacture, the leads do not extend outwardly beyond the periphery of the package to permit the leads to be electrically coupled to a substrate in a manner conventional for leaded packages. Consequently, the microelectronic components in these proposed packages can be electrically connected to other components only via the solder balls of the ball grid array. The leads in a conventional leaded package not only facilitate electrical connection to a substrate or other microelectronic component, but also provide a thermal pathway to conduct heat away from the package during operation. The lead frame/BGA design suggested in these four references sacrifice this advantage, as well.

One increasingly popular technique for maximizing device density on a substrate is to stack microelectronic devices on top of one another. Stacking just one device on top of a lower device can effectively double the circuitry within a given footprint; stacking additional devices can further increase the circuit density. In forming a stacked microelectronic device assembly, it is necessary to provide electrical connections between the underlying substrate and the upper component(s). Unfortunately, the packages proposed in these four patents only provide electrical connections on a single face of the package. This effectively prevents these microelectronic component packages from being stacked atop one another in a stacked component assembly. In particular, it may be possible to use one of these microelectronic component packages as the upper most package of a stacked microelectronic component assembly, but these microelectronic component packages would have marginal utility as the lower packages in a stacked assembly.

BRIEF DESCRIPTION OF THE DRAWINGS

FIG. 7 is a schematic bottom elevation view of the top microelectronic component in the microelectronic component assembly of FIGS. 5 and 6.

FIG. 8 is a schematic top elevation view of the bottom microelectronic component package of the microelectronic component assembly of FIGS. 5 and 6.

DETAILED DESCRIPTION

A. Overview

Figure 1:
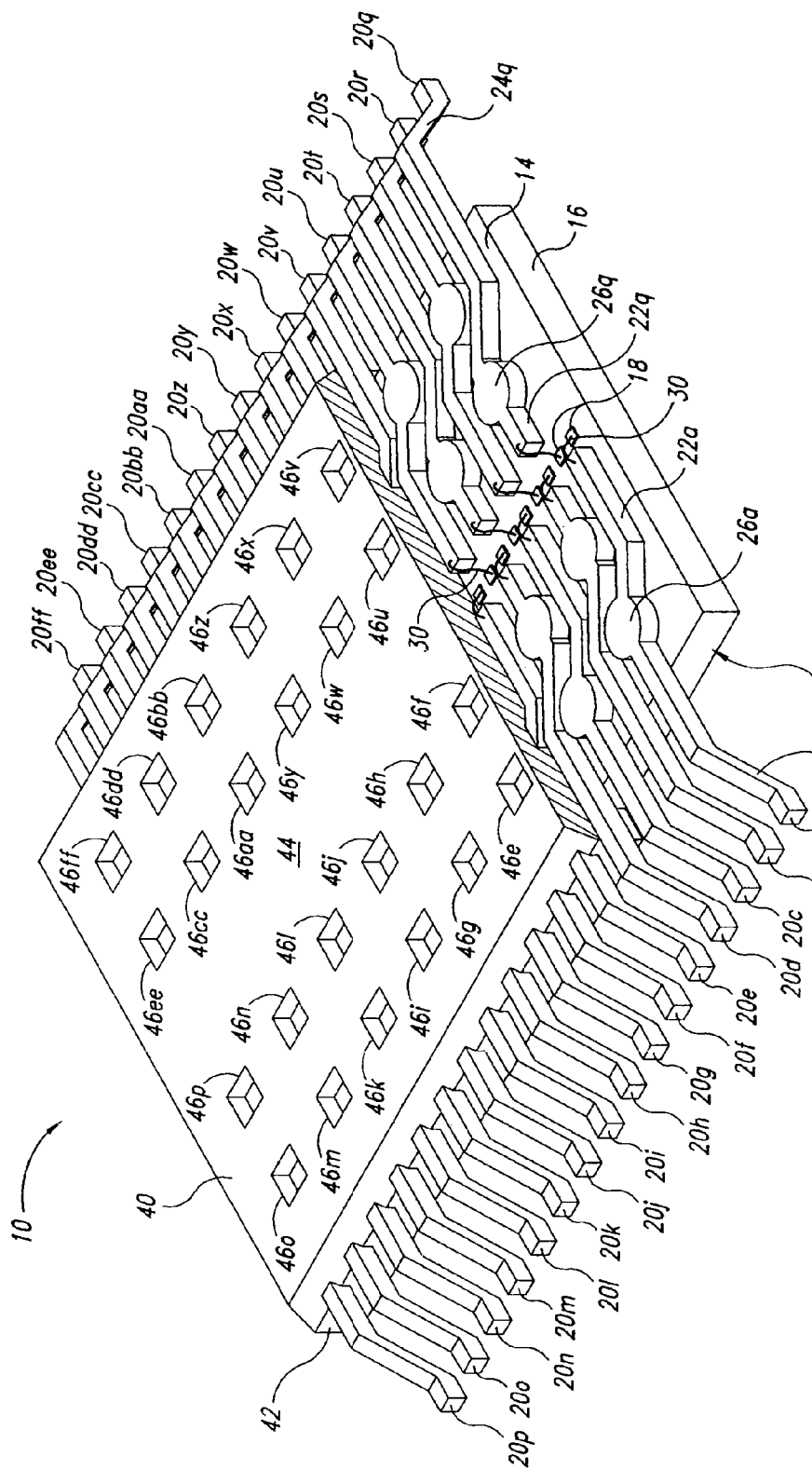
FIG. 1 is a schematic perspective view in partial cross section of a packaged microelectronic component in accordance with one embodiment of the invention.

Various embodiments of the present invention provide microelectronic components, microelectronic component assemblies, and methods for forming microelectronic components and microelectronic component assemblies. The terms "microelectronic component" and "microelectronic component assembly" may encompass a variety of articles of manufacture, including, e.g., SIMM, DRAM, flash-memory, ASICs, processors, flip chips, ball grid array (BGA) chips, or any of a variety of other types of microelectronic devices or components therefor.

In one embodiment, the present invention provides a microelectronic component package which includes a microelectronic component, an encapsulant, a plurality of electrical leads, and a plurality of terminals. The encapsulant encapsulates the microelectronic component and the encapsulant has a face and peripheral edge. At least some of the electrical leads are electrically coupled to the microelectronic component and each of the electrical leads has an exposed length extending transversely outwardly beyond the peripheral edge of the encapsulant. The plurality of terminals are arranged in a first terminal array, with each of the terminals being positioned proximate the face of the encapsulant. If so desired, each of the terminals may comprise an exposed surface of one of the electrical leads and this exposed surface may be spaced from the exposed length of that lead.

A microelectronic component package in accordance with another embodiment of the invention comprises a microelectronic component, an encapsulant, a first electrical lead, a second electrical lead, a first terminal, and a second terminal. The encapsulant encapsulates the microelectronic component. The encapsulant also has a peripheral edge and a terminal face. Each of the first and second electrical leads is electrically coupled to the microelectronic component and has an exposed length extending transversely outwardly beyond the peripheral edge of the encapsulant. The first terminal is positioned proximate the terminal face of the encapsulant and is associated with the first electrical lead. The second terminal is positioned proximate the terminal face of the encapsulant and is associated with the second electrical lead.

Another embodiment of the invention provides a microelectronic component assembly which includes the microelectronic component package of the preceding paragraph. This microelectronic component assembly also includes a substrate having first and second sockets adjacent a mounting site. The terminal face of the encapsulant is oriented away from the substrate. The exposed length of the first electrical lead is electrically coupled to the first socket and the exposed length of the second electrical lead is electrically coupled to the second socket. If so desired, the microelectronic component assembly may also include a second microelectronic component package. In one particular adaptation, this second microelectronic component package includes a second microelectronic component and an encapsulant encapsulating the second microelectronic component and having a confronting face that is oriented toward the substrate. The second microelectronic component package also includes a first electrical lead and a second electrical lead. The first electrical lead is electrically coupled to the second microelectronic component and to the first terminal of the first microelectronic component package. The second electrical lead is electrically coupled to the second microelectronic component and to the second terminal of the second microelectronic component package.

A microelectronic component assembly in accordance with another embodiment of the invention includes a substrate, a first microelectronic component package, and a second microelectronic component. The substrate has a mounting site, a first socket adjacent the mounting site, and a second socket adjacent the mounting site. The first microelectronic component package is mounted on the mounting site and includes a first microelectronic component, an encapsulant, a plurality of electrical leads, and a plurality of terminals. The encapsulant encapsulates the first microelectronic component and has a peripheral edge and a face that is oriented away from the substrate. At least some of the electrical leads are electrically coupled to the first microelectronic component, with each of the electrical leads having an exposed length extending transversely outwardly beyond the peripheral edge of the encapsulant. The terminals are arranged in a first terminal array, with each of the terminals being positioned proximate the face of the encapsulant and electrically coupled to one of the electrical leads. The second microelectronic component is carried by the first microelectronic component package and is electrically coupled to the substrate via the electrical leads of the first microelectronic component package.

Still another embodiment of the invention provides a method of manufacture in which a first microelectronic component is attached to a lead frame. Each of a plurality of contacts on the first microelectronic component is electrically coupled to one of a plurality of leads of the first lead frame. The microelectronic component and a portion of each of the leads is encapsulated in an encapsulant, leaving an exposed length of each lead extending outwardly beyond a periphery of the encapsulant. A plurality of terminals may be defined proximate a terminal face of the encapsulant, with each terminal being electrically associated with one of the leads. The exposed length of each lead may be bent to extend in a direction away from the terminal face of the encapsulant. In one specific application of this embodiment, the bent leads define a lead array and the method also includes inserting this lead array in a socket array carried by a substrate.

For ease of understanding, the following discussion is broken down into three areas of emphasis. The first section discusses certain microelectronic component packages; the second section relates to microelectronic component assemblies in select embodiments; and the third section outlines methods in accordance with other embodiments of the invention.

B. Microelectronic Component Packages

FIG. 1 is a schematic perspective cutaway view of a microelectronic component package 10 in accordance with one embodiment of the invention. The microelectronic component package 10 generally includes a microelectronic component 12, a plurality of leads 20a-ff, and an encapsulant 40. The microelectronic component 12 may have an active surface 14, which carries a plurality of electrical contacts 18, and a peripheral edge 16. As noted above, the microelectronic component 14 may take any of a variety of forms, including, e.g., memory modules (SIMM, DRAM, or flash memory), ASICs, or processors. In one embodiment, the microelectronic component 12 comprises a memory module which is adapted for stacking in a multi-module assembly, as detailed below.

Each of the leads 20 may have a length which extends adjacent and is physically attached to the active surface 14 of the microelectronic component 12 in a conventional fashion, e.g., with a die attach adhesive. Each of the leads 20 may have a component end (e.g., component end 22a of lead 20a) adjacent the contacts 18 of the microelectronic component 12. The component ends 22 of at least some of the leads 20 may be electrically coupled to one of the contacts 18 by a wirebond 30. As explained in further detail below in connection with FIGS. 7 and 8, in one embodiment one or more of the leads 20 is physically attached to the microelectronic component 20, but is not electrically coupled thereto.

Each of the leads 20a-x also includes an exposed length 24 (e.g., exposed length 24a of lead 20a) which extends laterally outwardly beyond a peripheral edge 42 of the encapsulant 40. These exposed lengths 24 may take any desired form. In the illustrated embodiment, the exposed lengths 24 are arranged in a "gull wing" configuration. The exposed lengths 24 extend both laterally outwardly beyond the encapsulant 40 and in a direction away from the terminal face 44 of the encapsulant 40, i.e., in a generally downward direction in the orientation shown in FIG. 1. This will facilitate connection of the microelectronic component package 10 to a substrate, e.g., a printed circuit board (PCB), as detailed below.

At least some of the leads 20 include at least one terminal 26 along the length between the component end 22 and the exposed length 24. In one embodiment, each of the leads 20 includes a single terminal 26 along its length. In the embodiment of the FIG. 1, the length of each lead 20 within the encapsulant 40 is substantially flat and extends in a plane parallel to the active surface 14 of the microelectronic component 12. The encapsulant 40, however, extends to a height greater than the thickness of the leads 20. As a consequence, the terminal surface 44 of the encapsulant 40 is higher than the surface of the terminals 26 facing away from the microelectronic component 12. To permit electrical access to the terminals 26, the encapsulant 40 may include a plurality of recesses 46a-ff, with one recess 46a-ff associated with a terminal 26 of each of the leads 20a-ff, respectively.

The terminals 26 of the leads 20 may be arranged in any desired relative configuration. In one embodiment, the terminals 26 are arranged in a regular array. This can facilitate connection to other microelectronic components (not shown) which have a mating ball grid array or the like. In the embodiment shown in FIG. 1, the leads have a somewhat irregular shape so that adjacent pairs of leads 20 have terminals 26 aligned with transversely aligned pairs of recesses 46 in the encapsulant 40. For example, the exposed lengths 24 of leads 20k and 20l are positioned side by side in a longitudinal direction, but the terminals of the leads 20k-l are exposed via two recesses 46k and 46l, respectively, that are aligned along a transverse line.

In one embodiment, each of the terminals 26 comprises a portion of the associated lead 20, with the surface of the terminal 26 comprising a bare surface of the lead 20. In another embodiment, the terminal includes an electrically conductive layer or extension carried by the lead 20. For example, the terminals may be coated with an electrically conductive polymer or with a metal layer, e.g., by electrolytic or electroless deposition.

Figure 2:
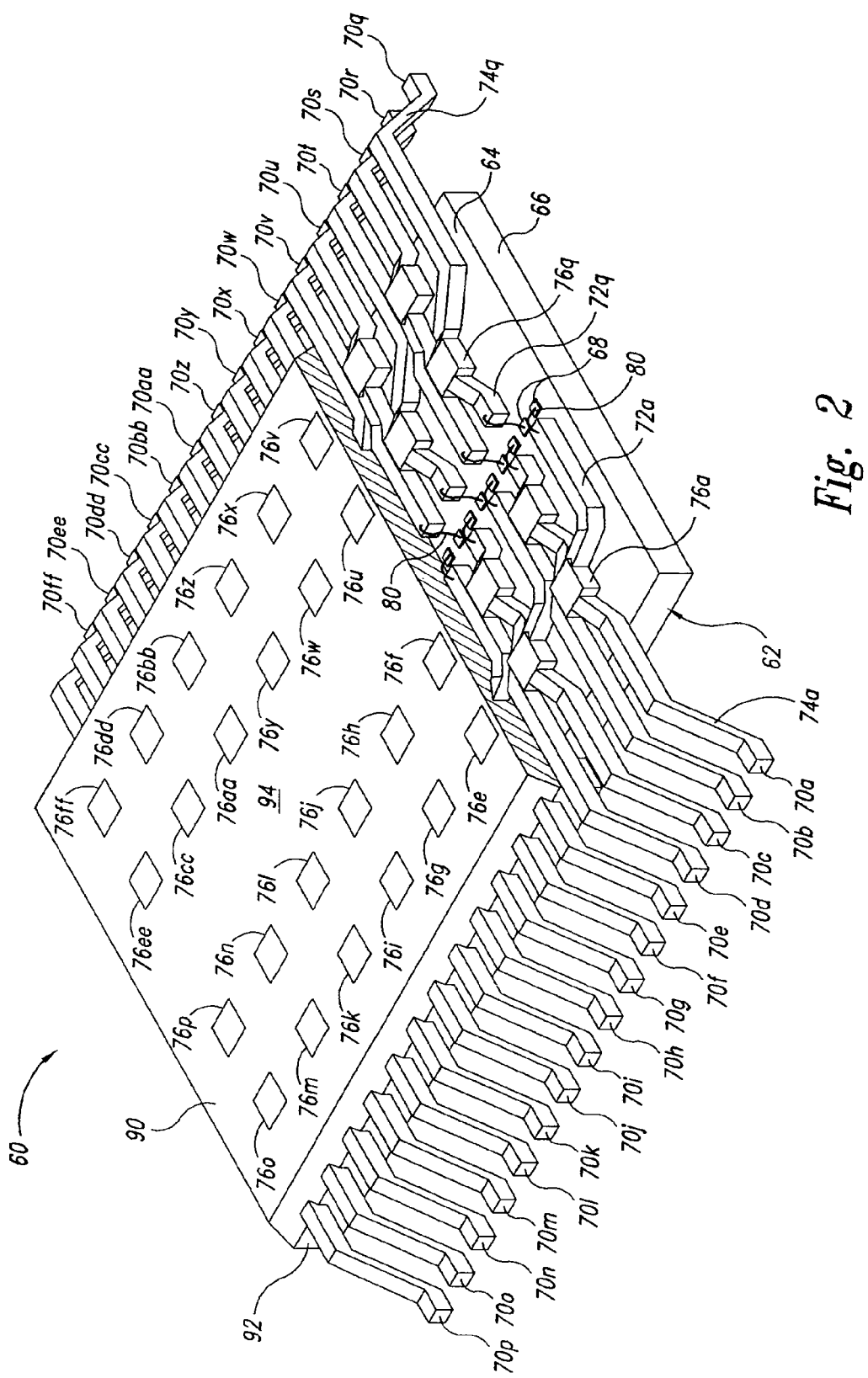
FIG. 2 is a schematic perspective view in partial cross-section of a packaged microelectronic component in accordance with another embodiment of the invention.

FIG. 2 is a schematic perspective cutaway view of a microelectronic component package 60 in accordance with another embodiment of the invention. Many of the components of the microelectronic component package 60 are similar to the components of the microelectronic component package 10 illustrated in FIG. 1. Hence, the microelectronic component package 60 includes a microelectronic component 62 having an active surface 64, a peripheral edge 66, and a plurality of electrical contacts 68 arranged on the active surface 64. A plurality of electrical leads 70a-ff are physically attached to the active surface 64 of the microelectronic component 62 and extend from a component end 72 adjacent the contacts 68 to an exposed length 74 which extends beyond the peripheral edge 92 of the encapsulant 90. The contacts 68 of the microelectronic component 62 may be electrically coupled to the component ends 72 of the leads 70 by wirebonds 80, for example.

One difference between the microelectronic component package 60 of FIG. 2 and the microelectronic component package 10 of FIG. 1 lies in the shape of the leads 70. As noted above, the encapsulated length of each of the leads 20 in the microelectronic component package 10 is substantially flat and extends generally parallel to the active surface 14 of the microelectronic component 12. In contrast, the electrical leads 70 elevate the terminals 76 above the active surface 64 of the microelectronic component 62. In particular, each of the terminals 76 (e.g., terminal 76a of lead 70a) is positioned along a length of a terminal offset 78 (e.g., terminal offset 78a). This terminal offset 78 is disposed between the component end 72 and the exposed length 74 of the lead 70. At least a portion of the length of the terminal offset 78 is positioned closer to the terminal face 94 of the encapsulant 90 than is the contact end 72 of the same lead 70. In the illustrated embodiment, the terminal 76 comprises an exposed length of the terminal offset 78 and the terminal 76 is substantially coplanar with the terminal face 94. In this embodiment, there is no need to form recesses (46 in FIG. 1) in the encapsulant 90 to expose the terminals 76. Although FIG. 2 illustrates all of the terminals 76 lying in a common plane which coincides with the face 94 of the encapsulant, this is not necessary; in one embodiment, the terminals 76 may lie in two or more separate common planes for specific applications.

C. Stacked Microelectronic Component Packages

One application where the microelectronic component packages 10 and 60 can be used to great advantage is in forming a stacked microelectronic component assembly. The exposed lengths of the leads may be used to form an electrical connection with a substrate, such as a printed circuit board, in conventional leaded package fashion. Another microelectronic component may then be electrically connected to the leads via the terminals associated with the leads, but carried on an exposed surface of the package.

Figure 3:
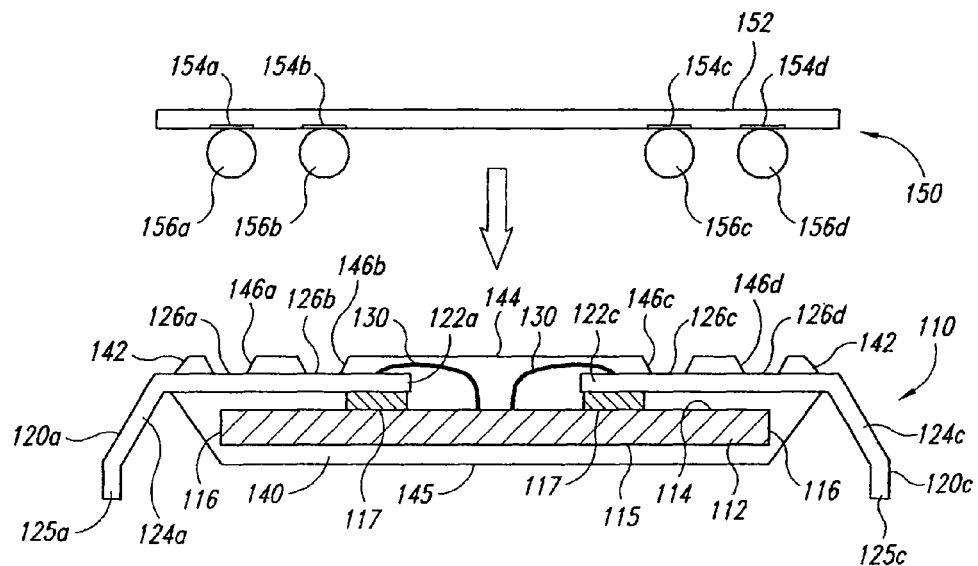
FIG. 3 is a schematic cross-sectional view of a stage in the manufacture of a microelectronic component assembly in accordance with another embodiment of the invention.
Figure 4:
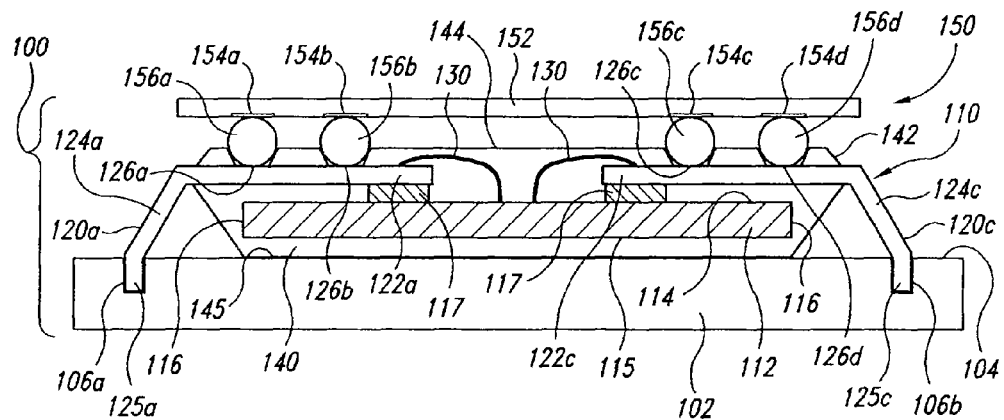
FIG. 4 is a schematic cross-sectional view of a finished microelectronic component assembly resulting from the process illustrated in FIG. 3.

FIGS. 3 and 4 schematically illustrate formation of a microelectronic component assembly 100 in accordance with an embodiment of the invention. This microelectronic component assembly 100 includes a first microelectronic component package 110 and a second microelectronic component 150. The first microelectronic component package 110 may be similar in many respects to the microelectronic component package 10 illustrated in FIG. 1, though some differences in the shape and/or arrangement of the features may be apparent by comparing the two Figures. The microelectronic component package 110 of FIG. 3 generally includes a first microelectronic component 112 having an active surface 114, a back surface 115, and peripheral edge 116. Each of a plurality of electrical contacts (not shown) on the active surface 114 may be electrically coupled to one of a plurality of electrical leads 120 (only two of which, 120a and 120c, are visible in the view of FIG. 3). Each of the leads 120 may be physically attached to the active surface 114 of the microelectronic component 112 by any suitable means, such as a layer of a die attach adhesive 117.

Each of the leads 120 may include an exposed length 124 (lengths 124a and 124c being shown in FIG. 3) that extends laterally beyond a peripheral edge 142 of the encapsulant 140. In the particular embodiment shown in FIGS. 3 and 4, the exposed length 124 extends outwardly and downwardly (in the orientation shown) away from the terminal face 144 of the encapsulant 140. The outward end of each exposed length 124 terminates in a pin 125 (pins 125a and 125c being shown) extending outwardly beyond a back face 145 of the encapsulant 140.

Each of the leads 120 has a terminal 126 associated with a recess 146 in the encapsulant 140. Hence, lead 120a includes a terminal 126a exposed via the recess 146a and lead 120c includes a terminal 126c exposed via the recess 146c. Two other recesses 146b and 146d are associated with two other terminals 126b and 126d. The lead 120b associated with terminal 126b falls behind the terminal 120a and is, therefore, hidden from view in FIG. 3. Similarly, the lead 120d associated with the terminal 126d is hidden from view in FIG. 3 by terminal 120c.

As noted above, the microelectronic component assembly 100 illustrated in FIGS. 3 and 4 also includes a second microelectronic component 150. This second microelectronic component 150 may comprise a conventional flip chip, which may include a semiconductor die 152 having a plurality of bond-pads 154a-b, each of which bears a solder ball 156a-d. Such flip chips and their method of manufacture are well-known in the art and need not be detailed here. As suggested in FIGS. 3 and 4, the second microelectronic component 150 may be juxtaposed with the first microelectronic component package 110 such that the solder balls 156a-d are brought into contact with the terminals 126a-d, respectively, of the microelectronic component package 110. These solder balls 156a-d may then be reflowed to mechanically and electrically connect the microelectronic component package 110 and the second microelectronic component 150 in a conventional fashion.

The assembled microelectronic component assembly 100 shown in FIG. 4 also includes a substrate 102. The substrate 102 may take any desired form. In one embodiment, the substrate 102 may be formed of material commonly used to manufacture microelectronic substrates, such as ceramic, silicon, glass, or combinations thereof. The substrate 102 can alternatively be formed of an organic material or other material suitable for PCBs. In one embodiment, the substrate 102 comprises a printed circuit board such as an FR-4 PCB.

The substrate 102 of FIG. 4 includes a plurality of pin sockets 106a, 106c. These sockets 106 are arranged in an array adjacent a component mounting site on the confronting surface 104 of the substrate 102. The socket array may be arranged to match an array of pins 125 on the microelectronic component package 110. When the back surface 145 of the package encapsulant 140 is brought into contact with the confronting surface 104 of the substrate 102, the pins 125 of the leads 120 may be inserted into the sockets 106, forming an electrical or electrical and mechanical connection. As is evident from FIG. 4, the back surface 145 is continuous and free of electrical connections and it may be placed directly against the confronting surface 104 of the substrate 102. At least some of the leads are electrically coupled to the first microelectronic component 112 via the bonding wires 130 and at least some of the leads 120 are connected to the second microelectronic component 150 via the solder connections 156. As a consequence, the leads 120 serve to electrically connect the first microelectronic component 112 and the second microelectronic component 150 to the substrate 102.

Figure 5:
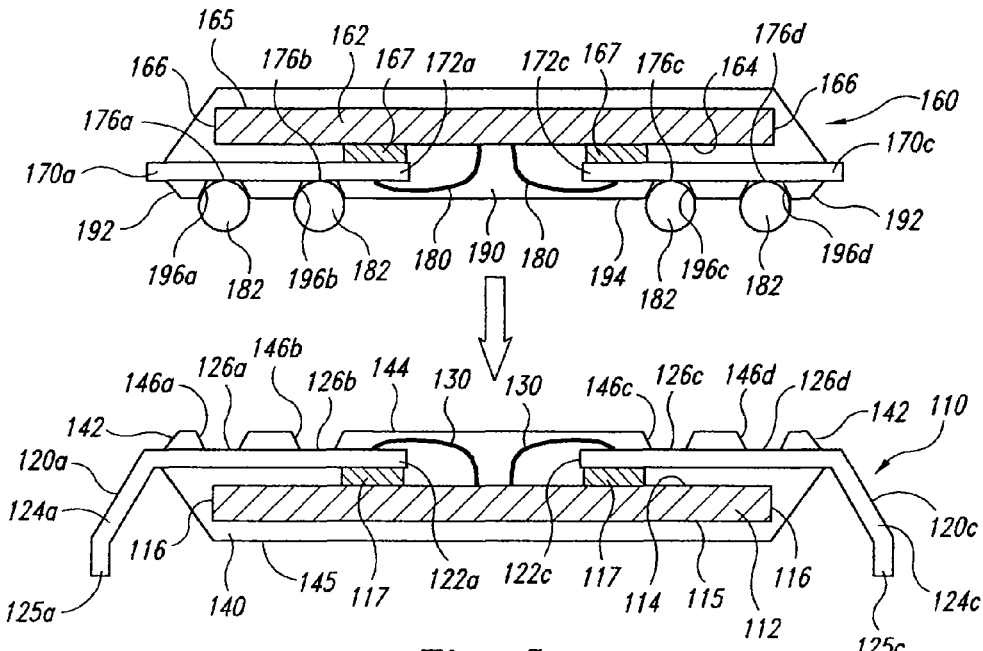
FIG. 5 is a schematic cross-sectional view illustrating a stage in the manufacture of a microelectronic component assembly in accordance with an alternative embodiment of the invention.
Figure 6:
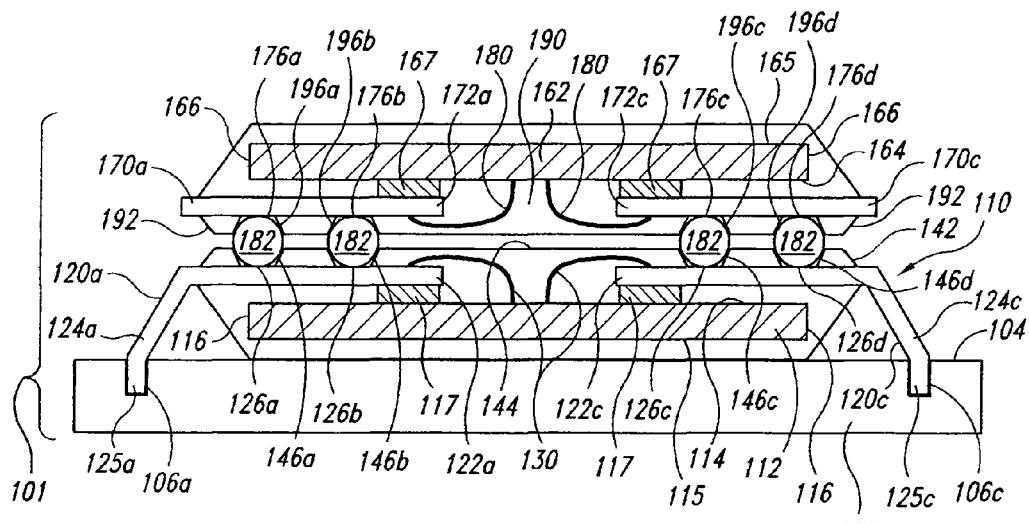
FIG. 6 is a schematic cross-sectional view of a microelectronic component assembly produced in the process illustrated in FIG. 5.

FIG. 6 schematically illustrates a microelectronic component assembly 101 in accordance with another embodiment of the invention, FIG. 5 schematically illustrates a stage in the process of manufacturing the microelectronic component assembly 101 and FIGS. 7 and 8 are elevation views of elements of the microelectronic component assembly 101. The microelectronic component assembly 101 generally includes a first microelectronic component package 110 and a second microelectronic component package 160. The first microelectronic component package 110 of FIGS. 5 and 6 may be substantially identical to the microelectronic component package 110 shown in FIGS. 3 and 4 and the same reference numbers are used in FIGS. 3-6 to illustrate the same elements of this microelectronic component package 110.

The microelectronic component assembly 101 employs a second microelectronic component package 160 instead of the unpackaged microelectronic component 150 shown in FIGS. 3 and 4. This second microelectronic component package 160 is similar in many respects to the microelectronic component package 110. In particular, the second microelectronic component package 160 includes a microelectronic component 162 having an active surface 164, a back surface 165, and a peripheral edge 166. A plurality of electrical leads 170 may be physically connected to the active surface 164 of the microelectronic component 162 by die attach adhesive pads 167. At least some of the leads 170 may be electrically coupled to the second microelectronic component 162 by wirebonds 180.

Unlike the leads 120 of the first microelectronic component package 110, the leads 170 of the second microelectronic component package 160 need not extend laterally beyond the peripheral edge 192 of the encapsulant 190. If so desired, the leads 170 may terminate within the encapsulant 190. For ease of manufacture, though, a short length of the leads 170 may protrude from the encapsulant 190. Each of the leads (e.g., leads 170a-d) includes a terminal (176a-d, respectively). Each of these terminals 176a-d may be exposed by an associated recess 196a-d, respectively, in the confronting face 194 of the encapsulant 190. An array of solder balls 182 may be attached to the terminal surfaces 176 through these recesses 196.

FIG. 7 is a schematic bottom elevation view of the second microelectronic component package 160 and FIG. 8 is a schematic top elevation view of the first microelectronic component package 110. To arrange the microelectronic component packages 110 and 160 in the configuration shown in FIGS. 5 and 6, the second microelectronic component package 160 would be flipped so that the bottom surface (shown in FIG. 7) would be juxtaposed with the top surface of the first microelectronic component 110 (shown in FIG. 8). (The solder balls 182 shown in FIGS. 5 and 6 have been omitted from FIG. 7 for clarity of illustration.) When the second microelectronic component package 160 is flipped, lead 170*a* will be juxtaposed with lead 120*a*, lead 170*b* will be juxtaposed with lead 120*b*, etc.

The first microelectronic component package 110 shown in FIG. 8 includes a first chip select lead CS1 and a second chip select lead CS2. The first chip select lead CS1 is electrically coupled to the first microelectronic component 112 by a wirebond 130. The second chip select lead CS2 has a component end which is spaced from the contacts on the microelectronic component 112 and the second chip select lead CS2 is not electrically coupled to the microelectronic component 112. The second microelectronic component package 160 of FIG. 7 similarly includes a first chip select lead CS1 and a second chip select lead CS2. In this package 160, the second chip select lead CS2 is electrically coupled to the second microelectronic component 162, but the first chip select lead CS1 is not electrically coupled to the second microelectronic component 162. When the second microelectronic component package 160 is flipped and juxtaposed with the first microelectronic component package 110, the terminals of the first chip select leads CS1 will be electrically coupled to one another by a solder ball (182 in FIGS. 5 and 6). Similarly, the terminals of the second chip select leads CS2 will be electrically coupled to one another by another solder ball.

These chip select leads CS1 and CS2 can be useful in stacked memory modules, permitting a memory controller to select which memory module is to be addressed, as known in the art. The two first chip select leads CS1 are electrically coupled to one another and to the first microelectronic component 112, but not to the second microelectronic component 162. The two second chip select leads CS2 are electrically coupled to one another and to the second microelectronic component 162, but not to the first microelectronic component 112. This permits the memory controller to selectively address either microelectronic component 112, 162, using the set of leads 120 of the first microelectronic component package 110.

Figure 9:
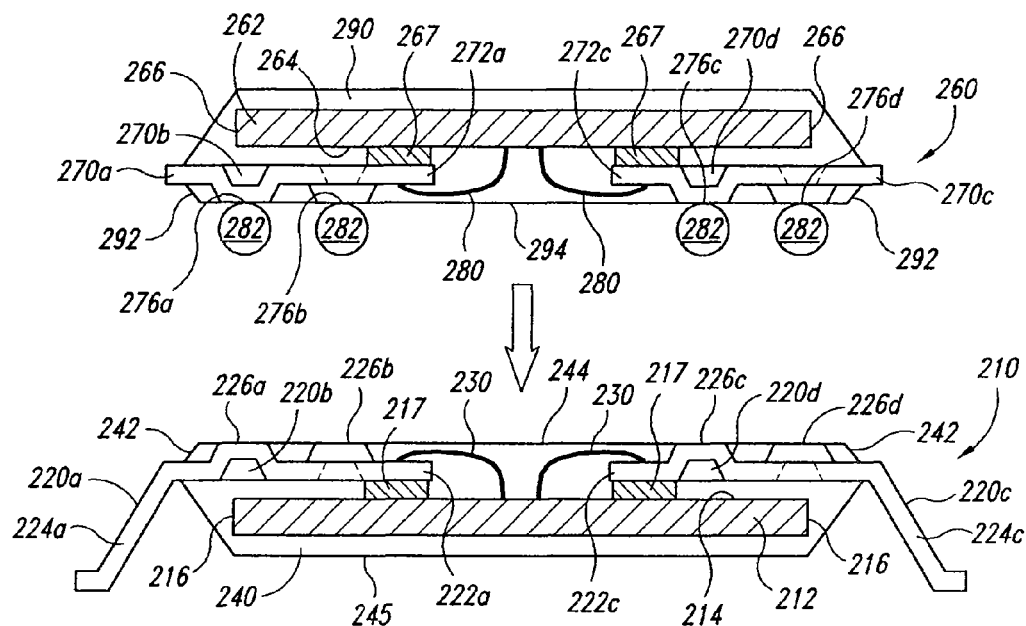
FIG. 9 is a schematic cross-sectional view of a stage in the manufacture of a microelectronic component assembly in accordance with another embodiment of the invention.
Figure 10:
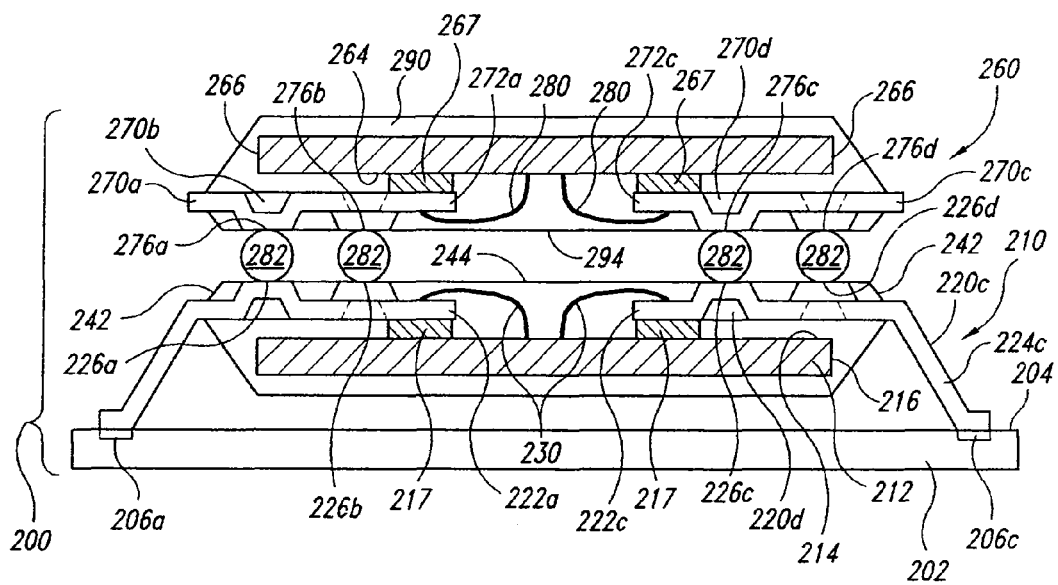
FIG. 10 is a schematic cross-sectional view of a microelectronic component assembly resulting from the process illustrated in FIG. 9.

FIG. 10 schematically illustrates a microelectronic component assembly 200 in accordance with yet another embodiment of the invention and FIG. 9 schematically illustrates a stage in the manufacture of the microelectronic component assembly 200. The microelectronic component assembly 200 includes a first microelectronic component package 210 and a second microelectronic component package 260. The first microelectronic component package 210 includes a first microelectronic component 212 having an active surface 214 and a peripheral edge 216. A plurality of electrical leads 220 may be physically attached to the active surface 214 of the microelectronic component 212 by a suitable die attach adhesive 217, for example. The microelectronic component 212 may be electrically coupled to the leads 220 by a plurality of wirebonds 230, with each of the wirebonds 230 being attached to a component end 222 of one of the leads 220.

The microelectronic component leads 220 shown in FIGS. 9 and 10 have terminal surfaces 226 which are coplanar with the terminal face 244 of an encapsulant 240. In this respect, the first microelectronic component package 210 is similar to the microelectronic component package 60 shown in FIG. 2 and discussed in detail above. A length of each of the leads 220 extends laterally outwardly beyond a peripheral edge 242 of the encapsulant 240.

The second microelectronic component package 260 has a somewhat similar structure. The second microelectronic component package 260 includes a second microelectronic component 262 having an active face 264 and a peripheral edge 266. A plurality of electrical leads 270 are physically attached to the active surface 264 by a suitable die attach adhesive 267, for example. The second microelectronic component 262 is electrically coupled to the leads 270 by a plurality of wirebonds 280, with each wirebond being electrically connected to a component end 272 of one of the leads 270. In the embodiment of FIGS. 5-8, the leads 170 are generally flat and the encapsulant 190 includes a plurality of recesses 196 to expose the terminals 176. The leads 270 of the second microelectronic component package 260 of FIGS. 9 and 10 are not flat, though. Instead, each of the leads 270 has a length that extends toward the confronting face 294 of the encapsulant 290, with a terminal surface 276 of each lead 270 being coplanar with the confronting face 294. Each of the terminals 276 may carry a solder ball 282 or other suitable electrically conductive joint, such as a suitable electrically conductive epoxy or adhesive.

In assembling the microelectronic component assembly 200, the first and second microelectronic component packages 210 and 260 may be moved toward one another, as suggested in FIG. 9, until the solder balls 282 carried by the second microelectronic component package 260 abut corresponding terminals 226 on the first microelectronic component package 210. The solder balls 282 may be reflowed to mechanically and electrically join the first and second microelectronic component packages 210, 260 in a conventional fashion.

Each of the leads 220 of the first microelectronic component package 210 may be electrically coupled to a substrate 202 via the exposed lengths 224 of the leads. Hence, the exposed length 224*a* of lead 220*a* may be electrically coupled to a bondpad 206*a* carried by the confronting face 204 of the substrate 202 and the exposed length 224*c* of lead 220*c* may be similarly coupled to bondpad 206*c* of the substrate 202. In the illustrated embodiment, the back face 245 of the first microelectronic component encapsulant 240 is spaced above the confronting face 204 of the substrate 202. By suitably reshaping the exposed lengths 224 of the leads 220, the back face 245 may be mounted flush with the confronting face 204 of the substrate 202 instead. If so desired, the space between the encapsulant 240 and the substrate 202, as well as the gap between the adjacent faces 244 and 294 of the first and second microelectronic component packages 210 and 260, may be filled with a conventional underflow material, if so desired.

D. Methods

The microelectronic component packages 10 and 60 may be formed in any suitable fashion. In manufacturing the microelectronic component package 10, for example, all of the leads 20 may be connected to a common lead frame (not shown). The microelectronic component 12 and at least a portion of each lead 20 may be positioned within a mold and encapsulated in an encapsulant compound. Any suitable microelectronic component packaging encapsulant may be utilized. For example, the encapsulant may comprise a silicone particle-filled thermoplastic polymer which is transfer molded, injection molded, or pot molded to form the desired shape and size of the encapsulant envelope 40. In forming the microelectronic component package 10 of FIG. 1, the recesses 46 in the encapsulant 40 may be formed in a variety of fashions. For example, the encapsulant 40 may comprise a photosensitive compound and the recesses 46 may be formed by applying a photomask on the terminal face 44, irradiating the terminal face 44, then selectively etching the recesses 46.

In another embodiment, the recesses 46 may be formed by projections in the mold employed in the molding process.

In forming the microelectronic component 60 of FIG. 2, the surfaces of the terminals 76 may be in contact with a surface of the mold cavity. When the encapsulant is delivered to the mold cavity, the contact between the terminals and the mold cavity will help keep the surfaces of the terminals 76 clean. In some circumstances, a thin film or "flash" coating of encapsulant may form between the terminals 76 and the adjacent mold cavity surface. If that occurs, it may be desirable to clean the film from the terminals 76 to facilitate a viable electrical connection with the terminal 76. The terminals may be cleaned, for example, by mechanical scrubbing or a chemical etch.

Once the leads 20 and microelectronic component 12 have been encapsulated in the encapsulant 40 and the terminals 26 of the microelectronic component package 10 have been defined, the exposed lengths 24 of the leads 20 can be bent to the desired shape. In the embodiment of FIG. 1, each of the exposed lengths 24 is bent to extend in a direction away from the terminal face 44 of the encapsulant 40. These bent leads may define a lead array. As noted above in connection with FIGS. 4 and 6, for example, this lead array may be inserted in a socket array carried by a substrate (e.g., the sockets 106 in the substrate 102 of FIG. 4).

If so desired, the microelectronic component package 10 or 60 may be attached to a substrate and/or to another microelectronic component. The following discussion focuses on the microelectronic component assembly 101 discussed above in connection with FIGS. 5-8. It should be understood, however, that this is solely for purposes of illustration and that the following methods need not be limited to the particular devices and structures illustrated in FIGS. 5-8.

The first microelectronic component package 110 can be attached to the substrate 102 in any desired fashion. For example, the pins 125 of the leads 120 may be inserted into the sockets 106 of the substrate 102 to electrically couple the first microelectronic component 112 to the substrate 102. If so desired, the back face 145 of the encapsulant 140 may be bonded to the confronting face 104 of the substrate 102, e.g., using a suitable adhesive. In one embodiment, the first microelectronic component package 110 is tested to ensure it meets predefined quality criteria before being attached to the substrate 102. Either in addition to or instead of this initial testing, the first microelectronic component package 110 may be tested in an intermediate test after it is electrically and physically attached to the substrate 102. This can help detect any product failures which are introduced in the process of attaching the first microelectronic component package 110 to the substrate 102. If the microelectronic component package 110 is determined to be defective, it may be removed from the substrate 102 and replaced with another microelectronic component package 10 or reworked on the substrate.

The second microelectronic component package 160 may be juxtaposed with the first microelectronic component package 110, with the ball grid array of solder balls 182 being aligned with the array of terminals 126 on the first microelectronic component package 110. The solder balls 182 may be brought into direct physical contact with the terminals 126 and heated to a reflow temperature in a conventional reflow operation. This can electrically and mechanically couple the second microelectronic component package 160 to the first microelectronic component package 110 and, via the leads 120, to the substrate 102. The assembled microelectronic component assembly 101 may be tested to ensure it meets desired performance criteria. If the assembly 101 fails, the microelectronic component packages 110 and 160 may be removed or reworked on a substrate level. This final testing may be performed either instead of or in addition to one or both of the initial and intermediate testing processes described above.

In an alternative embodiment, the second microelectronic component package 160 is attached to the first microelectronic component package 110 via the solder balls 182 prior to attaching the first microelectronic component package 110 to the substrate 102. This subassembly may be tested to identify any inadequate products before they are attached to the substrate 102. If so desired, a final testing may still be performed after the stacked subassembly is attached to the substrate 102 prior to shipping the microelectronic component assembly 101.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. When the claims use the word "or" in reference to a list of two or more items, that word covers all of the following interpretations of the word: any of the items in the list, all of the items in the list and any combination of the items in the list.

The above detailed descriptions of embodiments of the invention are not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while steps are presented in a given order, alternative embodiments may perform steps in a different order. The various embodiments described herein can be combined to provide further embodiments.

In general, the terms used in the following claims should not be construed to limit the invention to the specific embodiments disclosed in the specification, unless the above detailed description explicitly defines such terms. While certain aspects of the invention are presented below in certain claim forms, the inventors contemplate the various aspects of the invention in any number of claim forms. Accordingly, the inventors reserve the right to add additional claims after filing the application to pursue such additional claim forms for other aspects of the invention.

We claim:

1. A microelectronic component package, comprising:
   a microelectronic component having an active surface with bond pads and a non-active surface opposite from the active surface;
   an encapsulant encapsulating the microelectronic component, the encapsulant having a front face closer to the active surface of the microelectronic component package than to the non-active surface, a back face opposite from the front face, and a peripheral edge;
   a plurality of electrical leads, at least some of which are electrically coupled to the bond pads at the active side of the microelectronic component, each of the electrical leads having an exposed length extending transversely outwardly beyond the peripheral edge of the encapsulant, wherein the exposed lengths of the leads are configured to be connected to contacts of a separate substrate; and
   a plurality of terminals arranged in a first ball-grid array, each of the terminals having an electrically conductive contact surface exposed through the front face of the encapsulant and an encased surface directly opposite the contact surface, wherein the encased surface is oriented toward one of the faces of the microelectronic component, wherein the encased surface of the terminals is covered by the encapsulant and is electrically insulated within the encapsulant, and wherein the terminals are wider than the exposed portions of the leads.

2. The microelectronic component package of claim 1 wherein the exposed lengths of the electrical leads are arranged in an array adapted to be inserted in a socket array on a substrate.

3. The microelectronic component package of claim 1 wherein each of the contact surfaces of the terminals are coplanar with the face of the encapsulant.

4. The microelectronic component package of claim 1 wherein one of the electrical leads comprises a first chip select lead electrically coupled to a contact on the microelectronic component and another of the electrical leads is a second chip select lead which is not electrically coupled to the microelectronic component, but is electrically associated with one of the terminals.

5. The microelectronic component package of claim 1 wherein the terminals of the first ball-grid array have ball-pads spaced inwardly from the peripheral edge of the encapsulant.

6. The microelectronic component package of claim 1 wherein each of the terminals is electrically coupled to one of the electrical leads at a location spaced from the exposed length of the leads.

7. The microelectronic component package of claim 1 wherein the microelectronic component is a first microelectronic component, the microelectronic component package further comprising a second microelectronic component that is attached to the exposed surfaces of the terminals using a second ball-grid array.

8. The microelectronic component package of claim 7 wherein the second microelectronic component is a flip-chip.

9. A microelectronic component package, comprising:
a microelectronic component having an active surface with bond pads and a non-active surface opposite from the active surface;
an encapsulant encapsulating the microelectronic component, the encapsulant having a front face closer to the active surface of the microelectronic component package than to the non-active surface, a back face opposite from the front face, and a peripheral edge; and
a plurality of electrical lead means for electrically coupling bond pads of the microelectronic component to a substrate, each of the electrical lead means having an exposed length extending transversely outwardly beyond the peripheral edge of the encapsulant; and
a plurality of terminal means arranged in a first terminal array, each of the terminal means having a first side facing toward the active surface of the microelectronic component and a second side having an electrical contact area positioned proximate the front face of the encapsulant, wherein the encapsulant covers the first side of the terminal means directly opposite the electrical contact area, wherein the encapsulant does not cover at least a portion of the second side of the terminal means, and wherein the terminal means are wider than the exposed portions of the leads.

10. The microelectronic component package of claim 9, further comprising a second microelectronic component having a plurality of second terminals arranged in a second terminal array that is electrically coupled to the first terminal array.

11. The microelectronic component package of claim 9 further comprising a BGA package having a plurality of solder connections, each of which is electrically coupled to one of the terminals of the first terminal array.

12. The microelectronic component package of claim 9 further comprising a flip chip having a plurality of solder connections, each of which is electrically coupled to one of the terminals of the first terminal array.

13. The microelectronic component package of claim 9 wherein the microelectronic component is a first microelectronic component, the microelectronic component package further comprising a second microelectronic component that is attached to the second side of the terminal means with a ball-grid array that at least in part corresponds to the first terminal array.

14. The microelectronic component package of claim 13 wherein the second microelectronic component is a flip-chip.

15. The microelectronic component package of claim 9 wherein the exposed lengths of the electrical leads are arranged in an array adapted to be inserted in a socket array on a substrate.

16. The microelectronic component package of claim 9 wherein each of the second sides of the terminal means are coplanar with the face of the encapsulant.

17. The microelectronic component package of claim 9 wherein the second sides of the terminal means are spaced inwardly from the peripheral edge of the encapsulant.

18. The microelectronic component package of claim 9 wherein each of the terminal means is electrically coupled to one of the electrical lead means at a location spaced from the exposed length of the lead means.

\* \* \* \* \*